(12) United States Patent
Hofmann et al.

(10) Patent No.: US 10,788,744 B2
(45) Date of Patent: Sep. 29, 2020

(54) EXTREME ULTRAVIOLET LITHOGRAPHY MASK BLANK MANUFACTURING SYSTEM AND METHOD OF OPERATION THEREFOR

(71) Applicant: Applied Materials, Inc., Santa Clara, CA (US)

(72) Inventors: Ralf Hofmann, Soquel, CA (US); Cara Beasley, Scotts Valley, CA (US); Majeed Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 319 days.

(21) Appl. No.: 15/400,482

(22) Filed: Jan. 6, 2017

(65) Prior Publication Data

US 2017/0115555 A1   Apr. 27, 2017

Related U.S. Application Data

(62) Division of application No. 14/139,415, filed on Dec. 23, 2013, now abandoned.

(Continued)

(51) Int. Cl.
*G03F 7/16* (2006.01)
*G03F 1/22* (2012.01)

(Continued)

(52) U.S. Cl.
CPC ............... *G03F 1/22* (2013.01); *C23C 14/50* (2013.01); *C23C 16/4583* (2013.01); *G03F 7/16* (2013.01);

(Continued)

(58) Field of Classification Search
CPC ....... C23C 14/50; C23C 16/4583; G03F 1/22; G03F 7/16; H01J 37/32715;

(Continued)

(56) References Cited

U.S. PATENT DOCUMENTS

| 4,806,265 A | 2/1989 | Suzuki et al. |
| 4,842,675 A | 6/1989 | Chapman et al. |

(Continued)

FOREIGN PATENT DOCUMENTS

| CN | 1483157 A | 3/2004 |
| CN | 1488994 A | 4/2004 |

(Continued)

OTHER PUBLICATIONS

Non-Final Office Action in U.S. Appl. No. 15/167,740 dated Oct. 11, 2017, 30 pages.

(Continued)

*Primary Examiner* — Rodney G McDonald
(74) *Attorney, Agent, or Firm* — Servilla Whitney LLC

(57) ABSTRACT

A processing system includes: a vacuum chamber; a plurality of processing sub-systems attached around the vacuum chamber; and a wafer handling system in the vacuum chamber for moving the wafer among the plurality of processing systems without exiting from a vacuum. A physical vapor deposition system for manufacturing an extreme ultraviolet blank comprising: a target comprising molybdenum, molybdenum alloy, or a combination thereof.

14 Claims, 4 Drawing Sheets

Related U.S. Application Data

(60) Provisional application No. 61/778,402, filed on Mar. 12, 2013.

(51) Int. Cl.
    *C23C 14/50*     (2006.01)
    *C23C 16/458*     (2006.01)
    *H01J 37/32*     (2006.01)
    *H01J 37/34*     (2006.01)

(52) U.S. Cl.
    CPC .. *H01J 37/32715* (2013.01); *H01J 37/32899* (2013.01); *H01J 37/3405* (2013.01); *H01J 37/3417* (2013.01); *H01J 37/3447* (2013.01)

(58) Field of Classification Search
    CPC ............. H01J 37/32899; H01J 37/3405; H01J 37/3417; H01J 37/3447
    USPC ............................ 430/5; 204/192.11, 298.11
    See application file for complete search history.

(56) References Cited

U.S. PATENT DOCUMENTS

| | | |
|---|---|---|
| 5,427,671 A | 6/1995 | Ahmed |
| 5,645,646 A * | 7/1997 | Beinglass ......... H01L 21/68735 118/500 |
| 5,648,174 A | 7/1997 | Yamagata et al. |
| 6,010,916 A | 1/2000 | Horton et al. |
| 6,142,641 A | 11/2000 | Cohen et al. |
| 6,202,318 B1 | 3/2001 | Guldi et al. |
| 6,224,638 B1 | 5/2001 | Jevtic et al. |
| 6,231,674 B1 * | 5/2001 | Chen ................. C23C 16/45521 118/500 |
| 6,352,803 B1 | 3/2002 | Tong et al. |
| 6,656,643 B2 | 12/2003 | Gupta et al. |
| 6,780,496 B2 | 8/2004 | Bajt et al. |
| 6,908,714 B2 | 6/2005 | Yan et al. |
| 7,001,788 B2 | 2/2006 | Leon et al. |
| 7,005,227 B2 | 2/2006 | Yueh et al. |
| 7,186,630 B2 | 3/2007 | Todd |
| 7,279,252 B2 | 10/2007 | Aschke et al. |
| 7,282,318 B2 | 10/2007 | Jung |
| 7,541,297 B2 | 6/2009 | Mallick et al. |
| 7,736,820 B2 | 6/2010 | Van Herpen et al. |
| 7,867,923 B2 | 1/2011 | Mallick et al. |
| 7,892,719 B2 | 2/2011 | Hannah |
| RE42,388 E | 5/2011 | Summers |
| 7,960,077 B2 | 6/2011 | Ikuta et al. |
| 8,148,037 B2 | 4/2012 | Ono et al. |
| 8,465,903 B2 | 6/2013 | Weidman et al. |
| 8,524,382 B2 | 9/2013 | Ogimoto |
| 8,536,068 B2 | 9/2013 | Weidman et al. |
| 8,562,794 B2 | 10/2013 | Kageyama |
| 2001/0019803 A1 | 9/2001 | Mirkanimi |
| 2002/0015855 A1 * | 2/2002 | Sajoto ................. C23C 14/568 428/639 |
| 2002/0146648 A1 | 10/2002 | Ghandehari et al. |
| 2003/0051225 A1 | 3/2003 | Mori |
| 2003/0164998 A1 * | 9/2003 | Mirkarimi .............. B82Y 10/00 359/237 |
| 2003/0176079 A1 | 9/2003 | Sogard |
| 2003/0194615 A1 | 10/2003 | Krauth |
| 2004/0009410 A1 | 1/2004 | Lercel et al. |
| 2004/0018733 A1 | 1/2004 | Hak |
| 2004/0029041 A1 | 2/2004 | Shih et al. |
| 2004/0063004 A1 | 4/2004 | Alkemper |
| 2004/0091618 A1 | 5/2004 | Park et al. |
| 2004/0151988 A1 | 8/2004 | Silverman |
| 2004/0159538 A1 * | 8/2004 | Becker ................. C23C 14/46 204/192.11 |
| 2004/0175630 A1 | 9/2004 | Wasson et al. |
| 2004/0175633 A1 | 9/2004 | Shoki et al. |
| 2004/0211665 A1 | 10/2004 | Yoon et al. |
| 2004/0234870 A1 | 11/2004 | Aschke et al. |
| 2005/0008864 A1 | 1/2005 | Ingen Schenau et al. |
| 2005/0009175 A1 | 1/2005 | Bergh et al. |
| 2005/0064207 A1 | 3/2005 | Senzaki et al. |
| 2005/0064298 A1 | 3/2005 | Silverman |
| 2005/0084773 A1 | 4/2005 | Krauth |
| 2005/0085042 A1 | 4/2005 | Chun et al. |
| 2005/0121311 A1 | 6/2005 | Shidoji et al. |
| 2005/0155675 A1 | 7/2005 | Yoshitake |
| 2005/0199830 A1 | 9/2005 | Bowering et al. |
| 2005/0266317 A1 | 12/2005 | Gallagher et al. |
| 2006/0024589 A1 | 2/2006 | Schwarzl et al. |
| 2006/0166108 A1 | 7/2006 | Chandrachood et al. |
| 2006/0245057 A1 | 11/2006 | Van Herpen et al. |
| 2006/0251973 A1 | 11/2006 | Takaki et al. |
| 2006/0275547 A1 | 12/2006 | Lee et al. |
| 2007/0020903 A1 | 1/2007 | Takehara et al. |
| 2007/0099414 A1 | 5/2007 | Frohberg et al. |
| 2007/0117359 A1 | 5/2007 | Todd |
| 2007/0141257 A1 | 6/2007 | Takahashi et al. |
| 2007/0187228 A1 | 8/2007 | Nozawa et al. |
| 2007/0240453 A1 | 10/2007 | Uno et al. |
| 2007/0277734 A1 | 12/2007 | Lubomirsky et al. |
| 2008/0076252 A1 | 3/2008 | Kon |
| 2008/0113303 A1 | 5/2008 | Silverman |
| 2008/0123073 A1 | 5/2008 | Shiraishi et al. |
| 2008/0254216 A1 | 10/2008 | Kadota et al. |
| 2008/0257715 A1 * | 10/2008 | Hoghoj .................. B82Y 10/00 204/192.11 |
| 2009/0031953 A1 | 2/2009 | Ingle et al. |
| 2009/0091752 A1 | 4/2009 | Terasawa et al. |
| 2009/0176367 A1 | 7/2009 | Baks et al. |
| 2009/0278233 A1 | 11/2009 | Pinnington et al. |
| 2010/0099267 A1 | 4/2010 | Wang et al. |
| 2010/0133092 A1 | 6/2010 | Mashimo et al. |
| 2011/0117726 A1 | 5/2011 | Pinnington et al. |
| 2011/0151677 A1 | 6/2011 | Wang et al. |
| 2011/0236600 A1 | 9/2011 | Fox et al. |
| 2011/0267685 A1 | 11/2011 | Schreiber et al. |
| 2011/0297852 A1 | 12/2011 | Kameda et al. |
| 2011/0305978 A1 | 12/2011 | Iwashita et al. |
| 2012/0009765 A1 | 1/2012 | Olgado |
| 2012/0013976 A1 | 1/2012 | Weber |
| 2012/0099065 A1 | 4/2012 | Jang |
| 2012/0129083 A1 | 5/2012 | Yoshimori et al. |
| 2012/0141923 A1 | 6/2012 | Deweerd |
| 2012/0145534 A1 | 6/2012 | Kageyama |
| 2012/0147353 A1 | 6/2012 | Lafarre et al. |
| 2013/0094009 A1 | 4/2013 | Lafarre et al. |
| 2013/0115547 A1 | 5/2013 | Mikami et al. |
| 2013/0128248 A1 | 5/2013 | Komatsuda et al. |
| 2013/0157177 A1 | 6/2013 | Yu et al. |
| 2013/0210222 A1 | 8/2013 | Lee et al. |
| 2013/0330906 A1 | 12/2013 | Yu et al. |
| 2014/0159126 A1 | 6/2014 | Wei et al. |
| 2014/0256129 A1 | 9/2014 | Lai et al. |
| 2014/0268080 A1 | 9/2014 | Beasley et al. |
| 2014/0268081 A1 | 9/2014 | Hofmann et al. |
| 2014/0268082 A1 | 9/2014 | Michaelson et al. |
| 2014/0268083 A1 | 9/2014 | Barman et al. |
| 2014/0272684 A1 | 9/2014 | Hofmann et al. |
| 2015/0055108 A1 | 2/2015 | Huber et al. |

FOREIGN PATENT DOCUMENTS

| | | |
|---|---|---|
| CN | 1490848 A | 4/2004 |
| CN | 1501442 | 6/2004 |
| CN | 1538238 A | 10/2004 |
| CN | 1737687 A | 2/2006 |
| CN | 1756992 A | 4/2006 |
| CN | 102019266 A | 4/2011 |
| CN | 102782531 A | 11/2012 |
| JP | 57-15722 | 9/1982 |
| JP | 57-143826 | 9/1982 |
| JP | H05335215 A | 12/1993 |
| JP | 07-106234 | 4/1995 |
| JP | H07-106224 | 4/1995 |
| JP | H07180038 A | 7/1995 |
| JP | 2000331939 A | 11/2000 |
| JP | 2002222764 A | 8/2002 |

(56) References Cited

FOREIGN PATENT DOCUMENTS

| | | |
|---|---|---|
| JP | 2003501681 A | 1/2003 |
| JP | 200384419 A | 3/2003 |
| JP | 2003160854 A | 6/2003 |
| JP | 2003188100 A | 7/2003 |
| JP | 2003315977 A | 11/2003 |
| JP | 2004172272 A | 6/2004 |
| JP | 20044289110 A | 10/2004 |
| JP | 2005504885 A | 2/2005 |
| JP | 2006093454 A | 4/2006 |
| JP | 2006177740 A | 7/2006 |
| JP | 2008-135090 | 11/2006 |
| JP | 2007023380 A | 2/2007 |
| JP | 2007109971 A | 4/2007 |
| JP | 2007514293 A | 5/2007 |
| JP | 2007528608 A | 10/2007 |
| JP | 2010-122305 | 11/2008 |
| JP | 2009531254 A | 9/2009 |
| JP | 2009539269 A | 11/2009 |
| JP | 201153566 A | 3/2011 |
| JP | 2011181810 A | 9/2011 |
| JP | 2011192693 A | 9/2011 |
| JP | 2011222958 A | 11/2011 |
| JP | 2012503318 A | 2/2012 |
| JP | 2012248664 A | 12/2012 |
| JP | 6625520 B2 | 12/2019 |
| KR | 20090066318 A | 6/2009 |
| KR | 20090103847 A | 10/2009 |
| KR | 20110059771 A | 6/2011 |
| TW | 200622508 A | 7/2006 |
| TW | 200804212 A | 1/2008 |
| TW | 201031998 A | 9/2010 |
| WO | 95/08840 A1 | 3/1995 |
| WO | 99/53535 A1 | 10/1999 |
| WO | 00/73823 A1 | 12/2000 |
| WO | 2005091887 A2 | 10/2005 |
| WO | WO 2007/111067 * | 10/2007 |
| WO | 2010031483 A1 | 3/2010 |
| WO | 2012014904 A1 | 2/2012 |
| WO | 2013007442 A1 | 1/2013 |

OTHER PUBLICATIONS

Meltchakov, "Performance of multilayer coatings in relationship to microstructure of metal layers. Characterization and optical properties of Mo/Si multilayers in extreme ultra-violet and x-ray ranges", Journal of Physics: Condensed Matter, vol. 18, No. 13 (2006), pp. 3355-3365.

"Non-Final Office Action in U.S. Appl. No. 15/444,864, dated Jan. 4, 2019", 53 pgs.

Final Office Action in U.S. Appl. No. 15/167,740 dated May 16, 2018, 23 pages.

Final Office Action in U.S. Appl. No. 14/139,415 dated Oct. 7, 2016, 31 pages.

Final Office Action in U.S. Appl. No. 14/139,457 dated Jul. 22, 2016, 16 pages.

Non-Final Office Action in U.S. Appl. No. 14/139,371 dated Aug. 5, 2016, 37 pages.

Non-Final Office Action in U.S. Appl. No. 15/357,085 dated Jan. 30, 2017, 10 pages.

PCT International Preliminary Report on Patentability in PCT/US2014/025110 dated Sep. 15, 2015, 10 pages.

PCT International Preliminary Report on Patentability in PCT/US2014/025116 dated Sep. 15, 2015, 9 pages.

PCT International Preliminary Report on Patentability in PCT/US2014/025124 dated Sep. 15, 2015, 8 pages.

PCT International Preliminary Report on Patentability in PCT/US2014/026826 dated Sep. 15, 2015, 7 pages.

PCT International Search Report and Written Opinion in PCT/US2014/025110 dated Jul. 22, 2014, 12 pages.

PCT International Search Report and Written Opinion in PCT/US2014/025116 dated Jul. 22, 2014, 17 pages.

PCT International Search Report and Written Opinion in PCT/US2014/025124 dated Jul. 24, 2014, 10 pages.

PCT International Search Report and Written Opinion in PCT/US2014/026826 dated Jul. 15, 2014, 9 pages.

PCT International Search Report and Written Opinion in PCT/US2014/026844 dated Sep. 3, 2014, 9 pages.

Final Office Action in U.S. Appl. No. 15/444,864 dated Jun. 18, 2019, 13 pages.

Feigl, et al., "Magnetron sputtered EUV mirrors with high-thermal stability", Proc. SPIE 3997, Emerging Lithographic Technologies IV, (Jul. 21, 2000), pp. 420-430.

Soufli, et al., "Development and testing of EUV multilayer coatings for the atmospheric imaging assembly Instrument aboard the Solar Dynamics Observatory", Proc. SPIE 5901, Solar Ph and Space Weather Instrumentation, 59010M (Sep. 15, 2005).

Yakshin, A.E., et al., "Reduction of interlayer thickness by low-temperature deposition of Mo/Si multilayer mirrors for X-ray reflection", Applied Surface Science, 257 (2011), pp. 6251-6255.

Machine Translation of JP2011192693, 61 pgs.

* cited by examiner

EXTREME ULTRAVIOLET LITHOGRAPHY MASK BLANK MANUFACTURING SYSTEM AND METHOD OF OPERATION THEREFOR

CROSS-REFERENCE TO RELATED APPLICATION(S)

This application is a divisional of U.S. Non-Provisional application Ser. No. 14/139,415, filed Dec. 23, 2013, which claims the benefit of U.S. Provisional Patent Application Ser. No. 61/778,402 filed Mar. 12, 2013, to each of which priority is claimed and each of which are incorporated herein by reference in their entireties.

The present application contains subject matter related to concurrently filed U.S. patent application Ser. No. 14/139, 307. The related application is assigned to Applied Materials, Inc. and the subject matter thereof is incorporated herein by reference thereto.

The present application contains subject matter related to concurrently filed U.S. patent application Ser. No. 14/139, 371. The related application is assigned to Applied Materials, Inc. and the subject matter thereof is incorporated herein by reference thereto.

The present application contains subject matter related to concurrently filed U.S. patent application Ser. No. 14/139, 457. The related application is assigned to Applied Materials, Inc. and the subject matter thereof is incorporated herein by reference thereto.

The present application contains subject matter related to concurrently filed U.S. patent application Ser. No. 14/139, 507. The related application is assigned to Applied Materials, Inc. and the subject matter thereof is incorporated herein by reference thereto.

TECHNICAL FIELD

The present invention relates generally to extreme ultraviolet lithography blanks, and manufacturing and lithography systems for such extreme ultraviolet lithography blanks.

BACKGROUND

Extreme ultraviolet lithography (EUV, also known as soft x-ray projection lithography) is a contender to replace deep ultraviolet lithography for the manufacture of 0.13 micron, and smaller, minimum feature size semiconductor devices.

However, extreme ultraviolet light, which is generally in the 5 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor wafer.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light essentially at a single wavelength within a extremely narrow ultraviolet bandpass; e.g., 12 to 14 nanometer bandpass for 13 nanometer ultraviolet light.

There are various classes of defects in semiconductor processing technology which cause problems. Opaque defects are typically caused by particles on top of the multilayer coatings or mask pattern which absorb light when it should be reflected. Clear defects are typically caused by pinholes in the mask pattern on top of the multilayer coatings through which light is reflected when it should be absorbed. And phase defects are typically caused by scratches and surface variations beneath the multilayer coatings which cause transitions in the phase of the reflected light. These phase transitions result in light wave interference effects which distort or alter the pattern that is to be exposed in the resist on the surface of the semiconductor wafer. Because of the shorter wavelengths of radiation which must be used for sub-0.13 micron minimum feature size, scratches and surface variations which were insignificant before now become intolerable.

While progress has been made in reducing or eliminating particle defects and work has been done on repair of opaque and clear defects in masks, to date nothing has been done to address the problem of phase defects. For deep ultraviolet lithography, surfaces are processed to maintain phase transitions below 60 degrees. Similar processing for extreme ultraviolet lithography is yet to be developed.

For an actinic wavelength of 13 nanometers, a 180 degree phase transition in the light reflected from the multilayer coating may occur for a scratch of as little as 3 nanometers in depth in the underlying surface. This depth gets shallower with shorter wavelengths. Similarly, at the same wavelength, surface variations more abrupt than one (1) nanometer rise over one hundred (100) nanometers run may cause similar phase transitions. These phase transitions can cause a phase defect at the surface of the semiconductor wafer and irreparably damage the semiconductor devices.

In the past, mask blanks for deep ultraviolet lithography have generally been of glass but silicon or ultra low thermal expansion materials have been proposed as alternatives for extreme ultraviolet lithography. Whether the blank is of glass, silicon, or ultra low thermal expansion material, the surface of the mask blank is made as smooth as possible by such processes a chemical mechanical polishing, magnetorheological finishing, or ion beam polishing. The scratches that are left behind in such a process are sometimes referred to as "scratch-dig" marks, and their depth and width depend upon the size of the particles in the abrasive used to polish the mask blank. For visible and deep ultraviolet lithography, these scratches are too small to cause phase defects in the pattern on the semiconductor wafer. However, for extreme ultraviolet lithography, scratch-dig marks are a significant problem because they will appear as phase defects.

Due to the short illumination wavelengths required for EUV lithography the pattern masks used must be reflective mask instead of the transmissive masks used in current lithography. The reflective mask is made up of a precise stack of alternating thin layers of molybdenum and silicon, which creates a Bragg refractor or mirror. Because of the nature of the multilayer stack and the small feature size, any imperfections in the surface of the substrate on which the multilayer stack is deposited will be magnified and impact the final product. Imperfections on the scale of a few nanometers can show up as printable defects on the finished mask and need to be eliminated from the surface of the mask blank before deposition of the multilayer stack.

Typical masks used in optical lithography consist of a glass blank and a patterned chrome layer that blocks light transmission. In contrast in EUV lithography, the mask consists of a reflective layer and a patterned absorber layer. This architectural change is necessary due to the high absorbance of EUV light in most materials.

The reflector layer is a stack of 80 or more alternating layers of molybdenum and silicon. The precision for the layer thickness and smoothness of this stack is critical to achieve high reflectivity of the mask as well as line edge roughness, respectively.

Current technology employs glass polishing and cleaning processes to obtain a smooth substrate surface and ion beam deposition for the reflector layers.

This process flow does not meet the stringent defect specifications. The main causes of defects are pits and bumps in the glass substrate left behind by the polishing process as well as the subsequent cleaning. The ion beam deposition process further leaves particles embedded in and on top of the multilayer stack.

Thus, it is increasingly critical that answers be found to these problems and a system be developed that resolves these questions. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a processing system that includes: a vacuum chamber; a plurality of processing sub-systems attached around the vacuum chamber; and a wafer handling system in the vacuum chamber for moving a wafer among the plurality of processing systems without exiting from a vacuum.

An embodiment of the present invention provides a physical vapor deposition system for manufacturing an extreme ultraviolet blank comprising: a target comprising molybdenum, molybdenum alloy, or a combination thereof.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
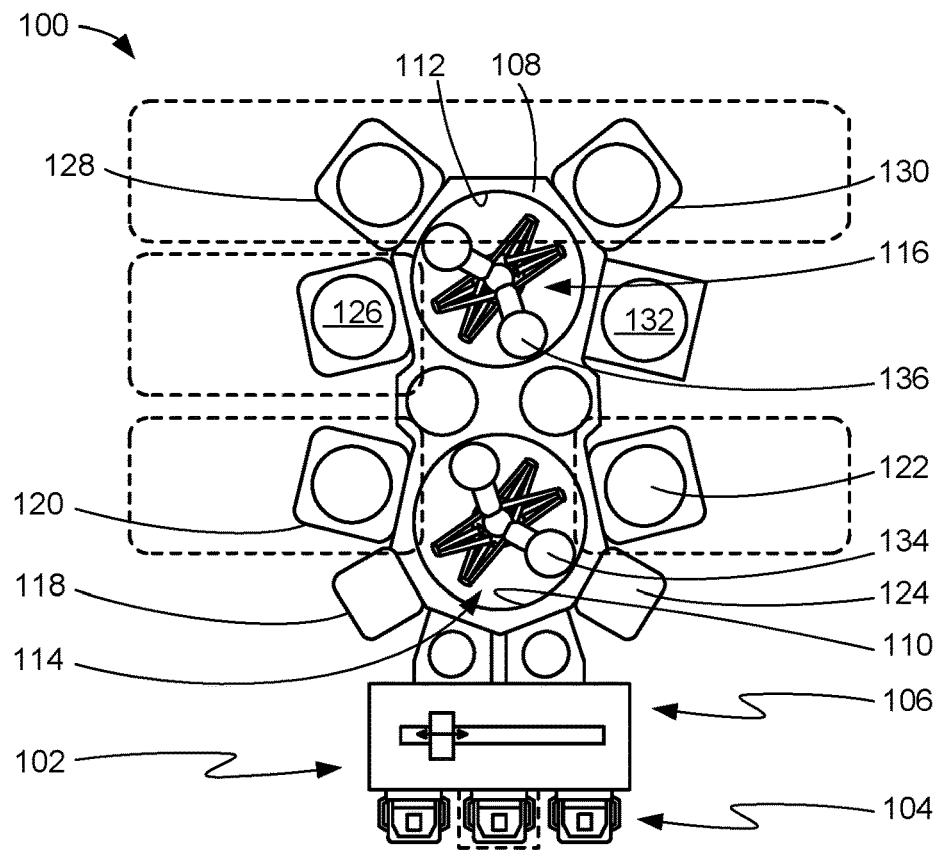
FIG. 1 is a shown an integrated extreme ultraviolet (EUV) mask production system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features will be described with similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

Embodiments of the present invention use various established techniques for depositing silicon, silicon oxide, and related films of compatible thermal expansion coefficient by CVD, PVD, ALD, and flowable CVD to fill the pits and bury the defects. Once deposited, the films surface maybe smooth and flat enough for further multilayer stack deposition, or may then be smoothed further using a variety of established smoothing or polishing techniques, including CMP, annealing, or ion beam polishing.

Referring now to FIG. 1, therein is shown an integrated extreme ultraviolet (EUV) mask production system 100 in accordance with an embodiment of the present invention. The integrated EUV mask production system 100 is a processing system that processes wafers or blanks on a carrier and that includes a mask blank loading and carrier handling system 102 into which mask blanks 104 are loaded.

An airlock 106 provides access to a wafer handling vacuum chamber 108. In the embodiment shown, the wafer handling vacuum chamber 108 contains two vacuum chambers, a first vacuum chamber 110 and a second vacuum chamber 112. Within the first vacuum chamber 110 is a first wafer handling system 114 and in the second vacuum chamber 112 is a second wafer handling system 116.

The wafer handling vacuum chamber 108 has a plurality of ports around its periphery for attachment of various other systems. The first vacuum chamber 110 has a degas system 118, a first physical vapor deposition system 120, a second physical vapor deposition system 122, and a preclean system 124.

The second vacuum chamber 112 has a first multi-cathode source 126, a flowable chemical vapor deposition (FCVD) system 128, a cure chamber 130, and a second multi-cathode source 132 connected to it. The FCVD system 128 can deposit a planarization layer on a substrate, a blank, or a wafer 136 and the cure chamber can cure the planarization layer. The second multi-cathode source 132 can deposit a multi-layer stack of reflective material and other systems can deposit a capping layer. The planarization layer, the multi-layer stack, and the capping layer all become part of the wafer 136.

The first wafer handling system 114 is capable of moving wafers, such as a wafer 134, among the airlock 106 and to one or more of the various systems around the periphery of the first vacuum chamber 110 and through slit valves in a continuous vacuum. The second wafer handling system 116 is capable of moving wafers, such as a wafer 136, around the second vacuum chamber 112 while maintaining the wafers in a continuous vacuum. The first wafer handling system 114, such as a first processing sub-system, and the second wafer handling system 116, such as a second processing sub-system, are capable of moving the wafer 136 selectively through one or all of the systems around the periphery of the first vacuum chamber 110 and the second vacuum chamber 112 to allow the various processes to be performed without having the wafer 136 exit from the vacuum until it is removed through the airlock 106, such as an output.

Figure 2:
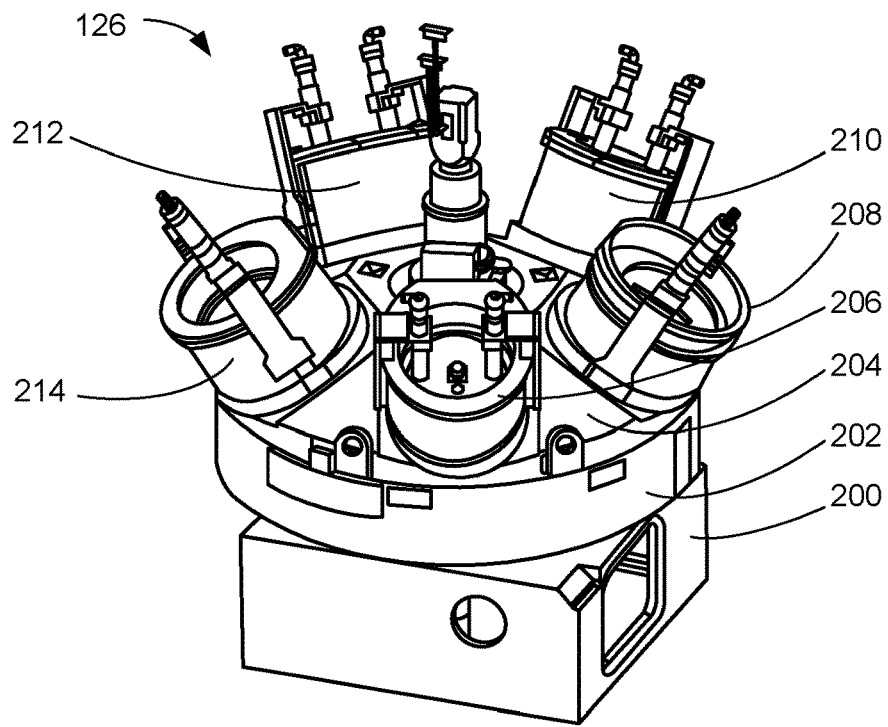
FIG. 2 is the first multi-cathode source in accordance with an embodiment of the present invention.

Referring now to FIG. 2, therein is shown the first multi-cathode source 126 in accordance with an embodiment of the present invention. The first multi-cathode source 126 includes a base structure 200 with a cylindrical body portion 202 capped by a top adapter 204.

The top adapter 204 has provisions for a number of cathode sources, such as cathode sources 206, 208, 210, 212, and 214, position around the top adapter 204.

Figure 3:
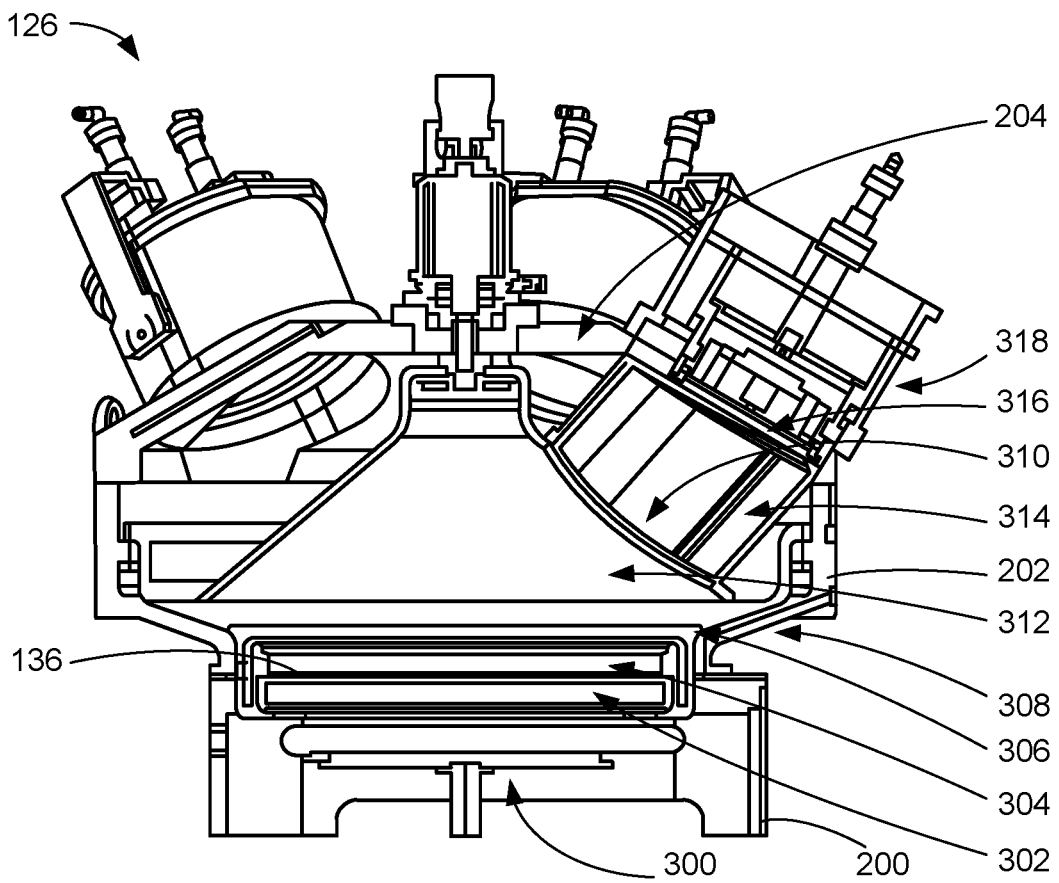
FIG. 3 is a cross-section of the first multi-cathode source in accordance with an embodiment of the present invention.

Referring now to FIG. 3, therein is shown a cross-section of the first multi-cathode source 126 in accordance with an embodiment of the present invention. The first multi-cathode source 126 has the base structure 200, the cylindrical body portion 202, and the top adapter 204.

Within the base structure 200 is a rotating pedestal 300 upon which a wafer, such as the wafer 136, can be secured. Above the rotating pedestal 300 is a covering ring 302 with an intermediate ring 304 above the covering ring 302. A conical shield 306 is above the intermediate ring 304 and is surrounded by a conical adapter 308.

A deposition area 310 for depositing material by physical vapor deposition (PVD) on the wafer 136 is surrounded by a rotating shield 312 to which a shroud 314 is affixed. Above the shroud 314 is one of a number of targets, such as a target 316, the source of the deposition material, and a cathode 318.

In an alternate embodiment, a number of individual shrouds 314 are each attached to an individual source and remain stationary as the rotating shield 312 rotates.

Figure 4:
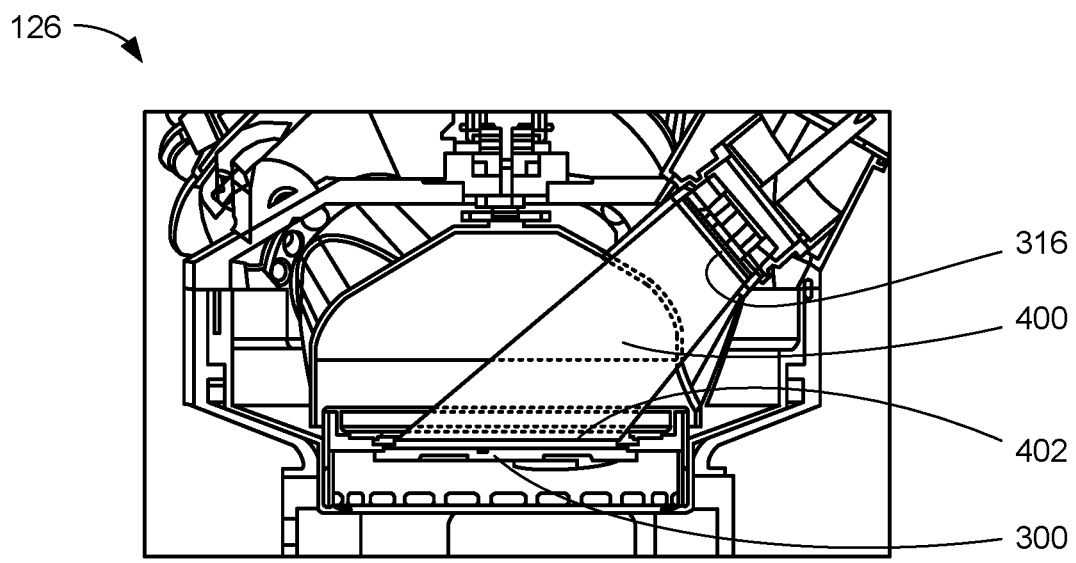
FIG. 4 is the cross-section of the first multi-cathode source in operation in accordance with an embodiment of the present invention.

Referring now to FIG. 4, therein is shown the cross-section of the first multi-cathode source 126 in operation in accordance with an embodiment of the present invention. The cross-section of the first multi-cathode source 126 shows an off-angled conical deposition pattern 400 with the rotating pedestal 300 shown moved into position for a material deposition on a wafer 402 from the target 316.

In operation, the rotating pedestal 300 with the wafer 136 is moved up into position where it is in view of the opening in the shroud 314 of FIG. 3. Depending on the design of the first multi-cathode source 126, there can be multiple shrouds 314 attached to the top adapter 204 so each source has its own shroud, or with one should that rotates with the rotating shield 312, or a single large rotating shield without the shroud.

The rotating shield 312 is then rotated among the various cathodes until the appropriate cathode 318 and target 316 are positioned to deposit material at an angle on the wafer 136 on the rotating pedestal 300.

By rotating the pedestal 300, the wafer 136 will receive a uniform deposition of target material on its surface.

Figure 5:
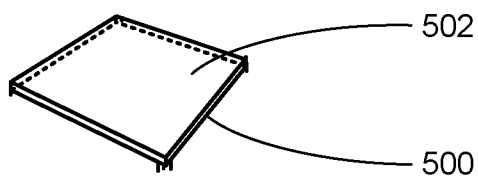
FIG. 5 is a mask blank which is square in shape and has a multi-layer stack in accordance with an embodiment of the present invention.

Referring now to FIG. 5, therein is shown a mask blank 500 which is square in shape and has a multi-layer stack 502 in accordance with an embodiment of the present invention.

Figure 6:
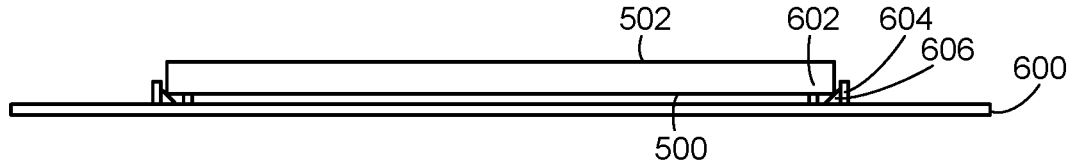
FIG. 6 is the mask blank in a supported position on a carrier in accordance with an embodiment of the present invention.

Referring now to FIG. 6, therein is shown the mask blank 500 in a supported position on a carrier 600 in accordance with an embodiment of the present invention. The mask blank 500 has the multi-layer stack 502 facing up and is supported on the carrier 600 on support pins 602 and is held in place laterally by retaining pins 604. A wedge-shaped support 606 can also be used at the bottom edge of the mask blank 500.

Figure 7:
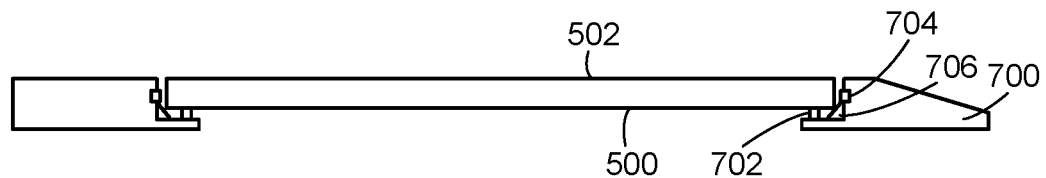
FIG. 7 is the mask blank in a supported position on a carrier in accordance with an embodiment of the present invention.

Referring now to FIG. 7, therein is shown the mask blank 500 in a supported position on a carrier 700 in accordance with an embodiment of the present invention. The mask blank 500 has the multi-layer stack 502 facing up and is supported on the carrier 700 on support pins 702 and is held in place laterally by retaining pins 704. A wedge-shaped support 706 can also be used at the bottom edge of the mask blank 500.

Figure 8:
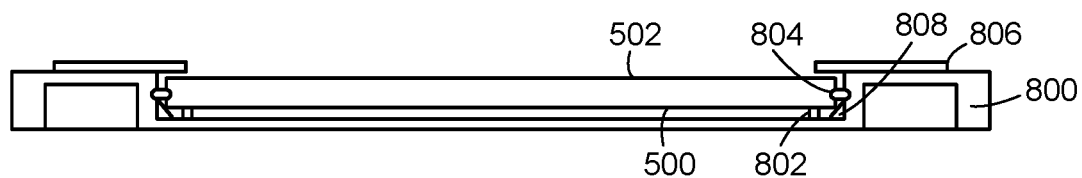
FIG. 8 is the mask blank in a supported position on a carrier in accordance with an embodiment of the present invention.

Referring now to FIG. 8, therein is shown the mask blank 500 in a supported position on a carrier 800 in accordance with an embodiment of the present invention. The mask blank 500 has the multi-layer stack 502 facing up and is supported on the carrier 800 on support pins 802 and is held in place laterally by retaining pins 804. The carrier 800 is slightly thicker than the thickness of the support pins 802 and the thickness of the mask blank 500. An edge exclusion cover mask 806 covers the edges of the mask blank 500 to prevent deposition of material in the edge areas of the multi-layer stack 502. A wedge-shaped support 808 can also be used at the bottom edge of the mask blank 500.

Figure 9:
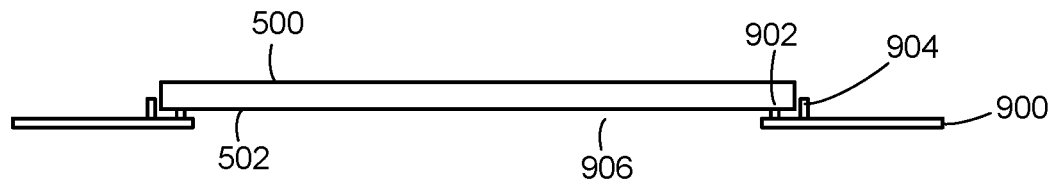
FIG. 9 is the mask blank in a supported position on a carrier in accordance with an embodiment of the present invention.

Referring now to FIG. 9, therein is shown the mask blank 500 in a supported position on a carrier 900 in accordance with an embodiment of the present invention. The mask blank 500 has the multi-layer stack 502 facing down and is supported on the carrier 900 on support pins 902 and is held in place laterally by retaining pins 904. The bottom side of the carrier 900 has an opening 906 to allow for deposition from below.

Figure 10:
FIG. 10 is the mask blank in a supported position on a carrier in accordance with an embodiment of the present invention.

Referring now to FIG. 10, therein is shown the mask blank 500 in a supported position on a carrier 1000 in accordance with an embodiment of the present invention. The mask blank 500 has the multi-layer stack 502 facing down and is supported on the carrier 1000 on support pins 1002 and is held in place laterally by retaining pins 1004. The bottom side of the carrier 1000 has an opening 1006 to allow for deposition from below.

Figure 11:
FIG. 11 is the mask blank in a supported position on a carrier in accordance with an embodiment of the present invention.

Referring now to FIG. 11, therein is shown the mask blank 500 in a supported position on a carrier 1100 in accordance with an embodiment of the present invention. The mask blank 500 has the multi-layer stack 502 facing down and is supported on the carrier 1100 on support pins 1102 and is held in place laterally by retaining pins 1104. The bottom side of the carrier has an opening 1106 to allow for deposition from below.

Figure 12:
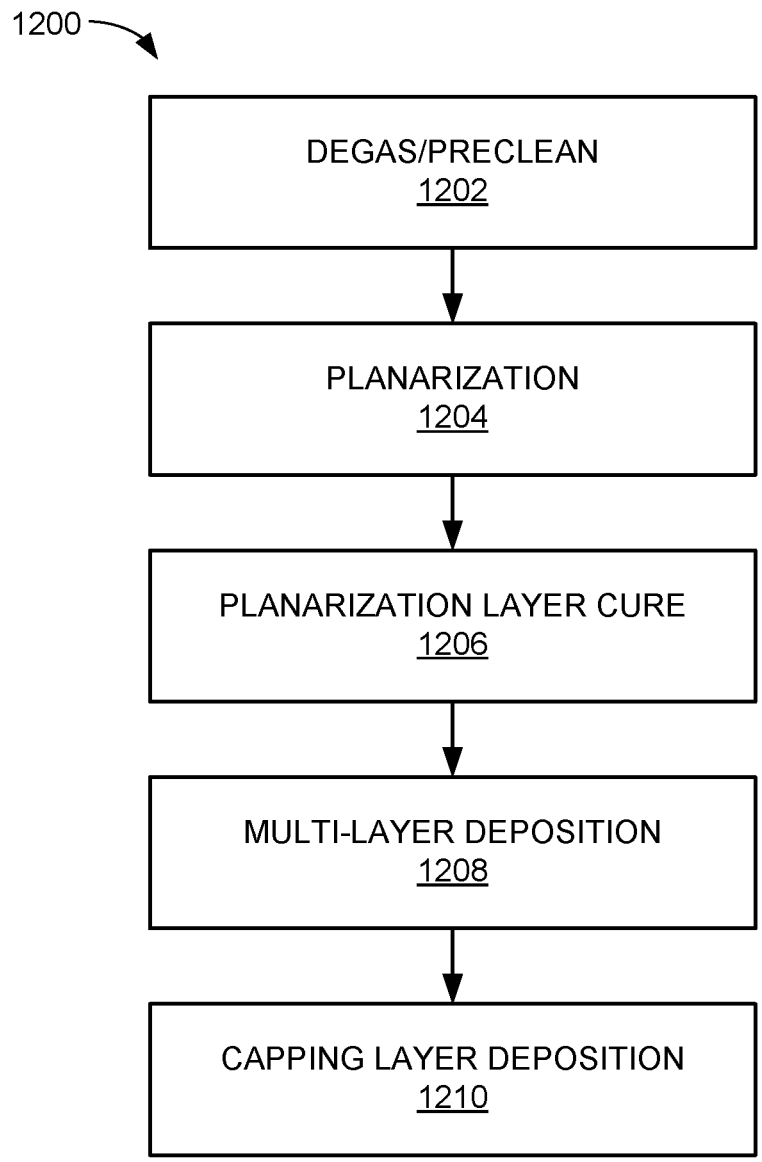
FIG. 12 is a method for making the mask blank with ultra-low defects.

Referring now to FIG. 12, therein is shown a method 1200 for making the EUV mask blank 500 of FIG. 5 with ultra-low defects. The method 1200 begins with a mask blank being supplied to a vacuum in the EUV mask production system 100 of FIG. 1.

The mask blank is degassed and precleaned in a step 1202. The planarization occurs in a step 1204. The planarization layer is deposited by CVD and is cured in a step 1206. The multi-layer deposition is performed by PVD in a step 1208 and the capping layer is applied in a step 1210. The degassing, precleaning, planarization, multi-layer deposition, and capping layer application is all performed in the EUV mask production system 100 without removing the mask blank from the vacuum.

The integrated EUV mask production system 100 of FIG. 1 can be used to make any type of lithographic blank, such as mask blanks and mirror blanks, as well as masks for a lithographic semiconductor manufacturing process.

Embodiments of the present invention provide an integrated tool concept for depositing the layer structure required on a EUV mask blank. These include smoothing layers to planarize defects on the glass blank (pits, scratches and particles in the few to tens of nm size range), the molybdenum and silicon multilayer stack deposition for the Bragg reflector, as well as the ruthenium capping layer (used to protect the molybdenum/silicon stack from oxidation).

By integrating these steps into one process tool, it has been found that it is possible to achieve better interface control as well as better defect performance by limiting the number of handling steps.

The substrate is placed on a carrier so that handling of the mask blank is minimized through multiple process steps. This will reduce the chance of handling-related particles on the substrate.

The use of a cluster tool also allows the integration of dry cleaning processes to improve substrate cleanliness and thus adhesion of the layer stack without breaking vacuum.

After loading the substrate into the integrated extreme ultraviolet (EUV) mask production system, the mask blank is first coated with a planarizing layer in a flowable CVD process, such as in the AMAT Eterna films, to fill pits and scratches on the substrate surface, as well as planarize any remaining small particles.

Next, the substrate is moved to the deposition chamber for the multi-layer deposition. The chamber integrates multiple targets so that the entire stack can be deposited in one chamber without the need to transfer the substrate.

The resulting system is straightforward, cost-effective, uncomplicated, highly versatile, and can be surprisingly and unobviously implemented by adapting known technologies, and are thus readily suited for efficiently and economically manufacturing EUV mask blanks.

Embodiments of the invention provide an atomically flat, low defect, smooth surface for an EUV mask blank. However, embodiments of the invention could also be used to manufacture other types of blanks, such as for mirrors. Over a glass substrate, embodiments of the invention can be used to form an EUV mirror. Further, embodiments of the invention can be applied to other atomically flat, low defect, smooth surface structures used in UV, DUV, e-beam, visible, infrared, ion-beam, x-ray, and other types of semiconductor lithography. Embodiments of the invention can also be to form various size structures that can range from wafer-scale to device level and even to larger area displays and solar applications.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of forming an extreme ultraviolet (EUV) mask blank, comprising:
   loading a substrate into an integrated production system;
   forming a planarization layer on the substrate by a flowable chemical vapor deposition process, which fills pits and scratches on the substrate surface and planarizes small particles on the substrate surface;
   curing the planarization layer in a cure chamber to provide a cured planarization layer; and
   forming a multi-layer stack over the cured planarization layer by physical vapor deposition wherein forming the planarization layer, curing the planarization layer and forming the multi-layer stack are performed in a production system without removing the substrate from vacuum.

2. The method of claim 1, wherein forming the multi-layer stack is performed in a deposition chamber having multiple targets so that an entire multi-layer stack is formed in a single chamber without transferring the substrate to another chamber.

3. The method of claim 2, wherein the multiple targets include a silicon target and a molybdenum target, and forming the multilayer stack comprises depositing alternating layers of molybdenum and silicon.

4. The method of claim 3, further comprising dry cleaning the substrate to improve adhesion of the multi-layer stack, wherein dry cleaning and forming the multi-layer stack occur without breaking vacuum.

5. The method of claim 3, wherein the substrate is placed on a rotating pedestal during deposition of the alternating layers.

6. The method of claim 5, wherein the alternating layers are deposited at an angle to the substrate while the pedestal is rotating.

7. The method of claim 3, further comprising placing a substrate on a carrier and moving the substrate on the carrier through multiple processing systems to minimize handling of the substrate through multiple process steps and reduce handling-related particles on the substrate, the multiple processing steps including forming the planarization layer, curing the planarization layer and forming the multilayer stack over the cured planarization layer.

8. The method of claim 7, further comprising supporting the substrate in the carrier with support pins and holding the substrate laterally in place with retaining pins.

9. The method of claim 8, wherein the carrier is thicker than the thickness of the support pins and the substrate.

10. The method of claim 9, further comprising covering the edge of the substrate to prevent deposition of material in edge areas of the multi-layer stack.

11. The method of claim 9, wherein the multi-layer stack is formed by deposition from below the substrate and the multi-layer stack faces down when the substrate is supported in the carrier.

12. The method of claim 9, wherein the multi-layer stack faces up when the substrate is supported in the carrier.

13. The method as claimed in claim 4 further applying a capping layer to the multi-layer stack without removing the substrate from the vacuum.

14. The method of claim 13, further comprising placing a substrate on a carrier and moving the substrate on the carrier through multiple processing systems to minimize handling of the substrate through multiple process steps and reduce handling-related particles on the substrate, the multiple processing steps including forming the planarization layer, curing the planarization layer, forming the multilayer stack over the cured planarization layer and forming the capping layer.

\* \* \* \* \*